(12) United States Patent
Oda

(10) Patent No.: US 7,499,328 B2
(45) Date of Patent: Mar. 3, 2009

(54) ELECTRICALLY WRITABLE NON-VOLATILE MEMORY

(75) Inventor: Daisuke Oda, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 0 days.

(21) Appl. No.: 11/592,162

(22) Filed: Nov. 3, 2006

(65) Prior Publication Data
US 2007/0133302 A1    Jun. 14, 2007

(30) Foreign Application Priority Data
Dec. 1, 2005    (JP) .............................. 2005-347676

(51) Int. Cl.
*G11C 16/04*    (2006.01)
(52) U.S. Cl. ........................... 365/185.17; 365/185.23; 365/185.25
(58) Field of Classification Search ............ 365/185.17, 365/185.23, 185.25
See application file for complete search history.

(56) References Cited
U.S. PATENT DOCUMENTS
6,088,265 A     7/2000    Ohta
6,233,168 B1    5/2001    Kokubun et al.
6,611,457 B2 *  8/2003    Egawa ................... 365/185.05

FOREIGN PATENT DOCUMENTS
JP    06-068683    3/1994

* cited by examiner

*Primary Examiner*—Huan Hoang
(74) *Attorney, Agent, or Firm*—Studebaker & Brackett PC; Donald R. Studebaker

(57) ABSTRACT

A memory cell array circuit of a non-volatile memory selects the drain electrodes of the memory cells, interconnected to word lines and bit lines, by two drain selectors, adapted for selecting the drain electrodes in two selection routes, so that the memory cell array circuit will select the drain electrodes in four selection routes. In writing in the memory cells, the drain electrodes of the memory cells are selected at a rate of one out of four drain electrodes and the voltage CDV is applied to the so selected drain electrode. This decreases the potential difference between the drain and source electrodes of the non-selected memory cells to prevent the erroneous writing in the non-selected memory cells. A method for writing in the memory is also provided.

8 Claims, 12 Drawing Sheets

ELECTRICALLY WRITABLE NON-VOLATILE MEMORY

BACKGROUND OF THE INVENTION

1. Field of the Invention

The present invention relates to an electrically writable, non-volatile memory.

2. Description of the Background Art

A conventional non-volatile memory is made up of a memory cell array, a row decoder, a column decoder, a cell drain voltage (CDV) generator and a VPP circuit, as disclosed for example by the Japanese Patent Laid-Open Publication No. 68683/1994 and U.S. Pat. No. 6,088,265 to Ohta. The memory cell array thus disclosed is comprised of a plurality of memory cells interconnected to a plural number of word lines and a plural number of bit lines. The row decoder is adapted to define a row address to control the appropriate gate electrodes, or word lines, of the memory cell array, and the column decoder is to define a column address to control the appropriate source electrodes, or bit lines, thereof. The CDV generator supplies the cell drain voltage (CDV) to the drain electrodes of the memory cells, and the VPP circuit supplies a high voltage VPP to the row decoder.

During the write operation, the row decoder is responsive to an address signal Ain to apply the voltage VPP to an appropriate word line. The column decoder selects an appropriate bit position. For readout, the CDV generator supplies a ground (GND) level voltage (voltage 0[V]) to the drain electrode of a memory cell, while, for writing, the CDV generator supplies a voltage level VCC to the drain electrode of the memory cell.

As such a non-volatile memory, there are disclosed by for example U.S. Pat. No. 6,233,168 to Kokubun et al., the configuration of a non-volatile memory having four drain lines and a readout method therefor.

However, in the conventional system for writing in such memory cells, one of two drain electrodes is selected to apply an electrical voltage CDV thereto with the non-selected drain electrode being in its open state. Thus, a voltage equal to (CDV−threshold voltage Vt)/2 is generated even at the drain electrode of a memory cell which is not the target for writing. Consequently, there is fear that erroneous writing may occur in a memory cell which is not intended to be selected.

For example, with the voltage VCC of 4.4 V and the threshold voltage Vt of approximately 0.8 V, there is caused a difference in potential of approximately 1.8 V on a path between the source and drain electrodes of a memory cell by the voltage equal to (CDV−threshold voltage Vt)/2. In such a case, there is fear that erroneous writing may take place because the current flows through the memory cell.

On the other hand, the above patent publications teach the method of readout but fail to disclose a method for writing which will prevent erroneous writing in memory cells.

SUMMARY OF THE INVENTION

It is an object of the present invention to provide a non-volatile memory in which it is made possible to prevent erroneous writing in memory cells.

The present invention provides a non-volatile memory for storing data electrically writably. The non-volatile memory includes a memory cell array. The memory cell array includes a plurality of rows of memory cells, each of the rows of memory cells being formed by a series connection of source and drain electrodes of a plurality of memory cell transistors constituting the memory cells. The memory cell array also includes a plurality of word lines each interconnecting the gate electrodes of the memory cell transistors of the rows of memory cells, and a plurality of bit lines interconnecting connecting points of the memory cell transistors of the rows of memory cells in a direction substantially perpendicular to the memory rows. The memory cell array also includes a first drain selector connected to ones of the bit lines at a first interval for selecting the drain electrodes of the memory cell transistors. The first interval corresponds to a predetermined number of the memory cell transistors. The memory cell array also includes a second drain selector for selecting the drain electrodes of the memory cell transistors. The second drain selector is connected to other ones of the bit lines at an interval equal to the first interval, which are shifted in position from the first interval by a value equal to one-half of the predetermined number of the memory cell transistors. The memory cell array also includes a source selector for selecting the source electrodes of the memory cell transistors. The source selector is connected to the bit lines lying intermediate between the bit lines to which the first and second drain selectors are connected. Each of the first and second drain selectors includes a plurality of transistors for selecting the drain electrodes in a plurality of selection routes.

According to the present invention, it is possible to prevent erroneous writing in non-selected memory cells in which no data is written.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 2:
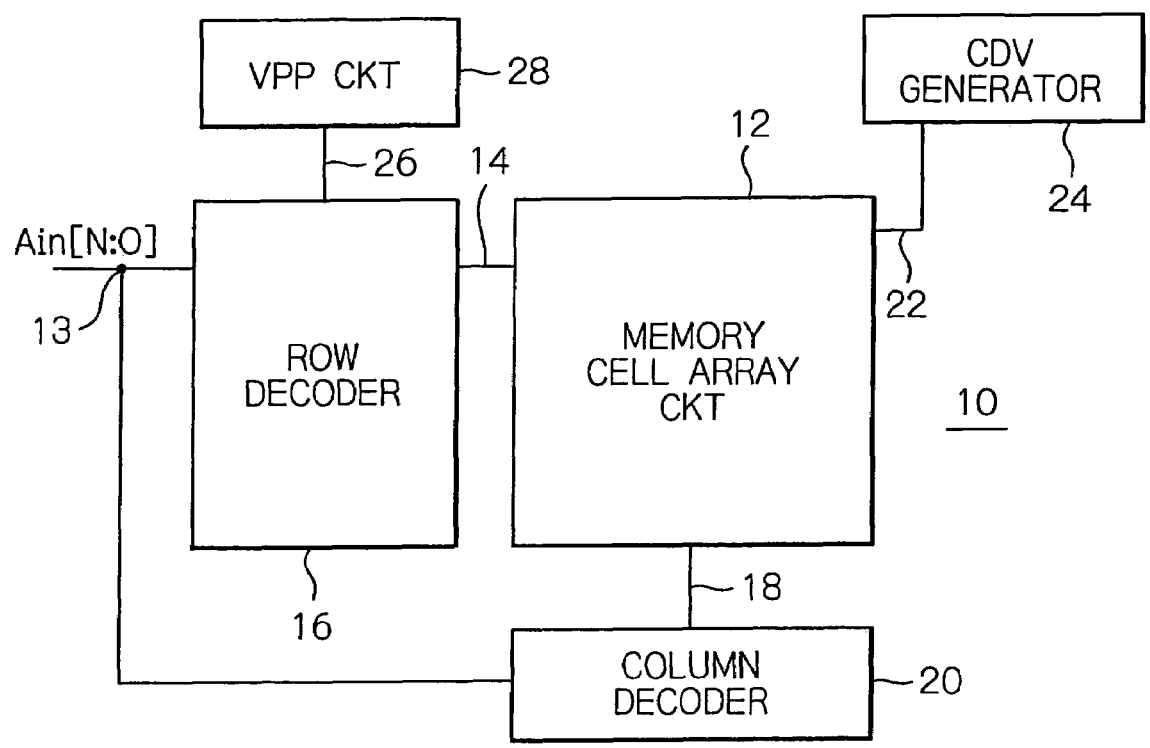
FIG. 2 is a schematic block diagram showing an embodiment of a non-volatile memory according to the present invention.

With reference to the accompanying drawings, preferred embodiments of a non-volatile memory and a writing method therefor will be described in detail according to the present invention. Referring first to FIG. 2, a non-volatile memory 10 according to the present invention includes a memory cell array circuit 12, a row decoder 16, a column decoder 20, a cell drain voltage (CDV) generator 24 and a VPP circuit 28, which are interconnected as illustrated.

The memory cell array circuit 12 includes a plurality of memory cells 100, arranged bi-dimensionally and interconnected to plural word lines WL1-WLn and plural bit lines 18, which will be described later with reference to FIG. 1, where n is a natural number. The row decoder 16 is adapted to be responsive to an address Ain[N:0] entered on its input 13 to select or define an appropriate row address to control the gate electrodes or word lines 14 of the memory cell array circuit 12, where N is a positive integer. The column decoder 20 is adapted to be responsive to the address Ain[N:0] entered on its input 13 to select or define an appropriate column address to control the source electrodes or bit lines 18 of the memory cell array circuit 12. The CDV generator 24 is adapted for applying the cell drain voltage (CDV) to the drain electrodes of the memory cells over a connection line 22. The VPP circuit 28 is adapted for generating a high voltage VPP to supply the voltage VPP over a connection line 26 to the row decoder 16.

During the write operation, the row decoder 16 is responsive to the address signal Ain to apply the voltage VPP to appropriate one of the word lines WL1-WLn, while the column decoder 20 selects an appropriate bit. During readout, the CDV generator 24 generates the ground (GND) level (voltage of 0 volt [V]) and, during writing, the CDV generator 24 supplies the voltage level VCC to the drain electrodes of the memory cells 100.

Figure 1:
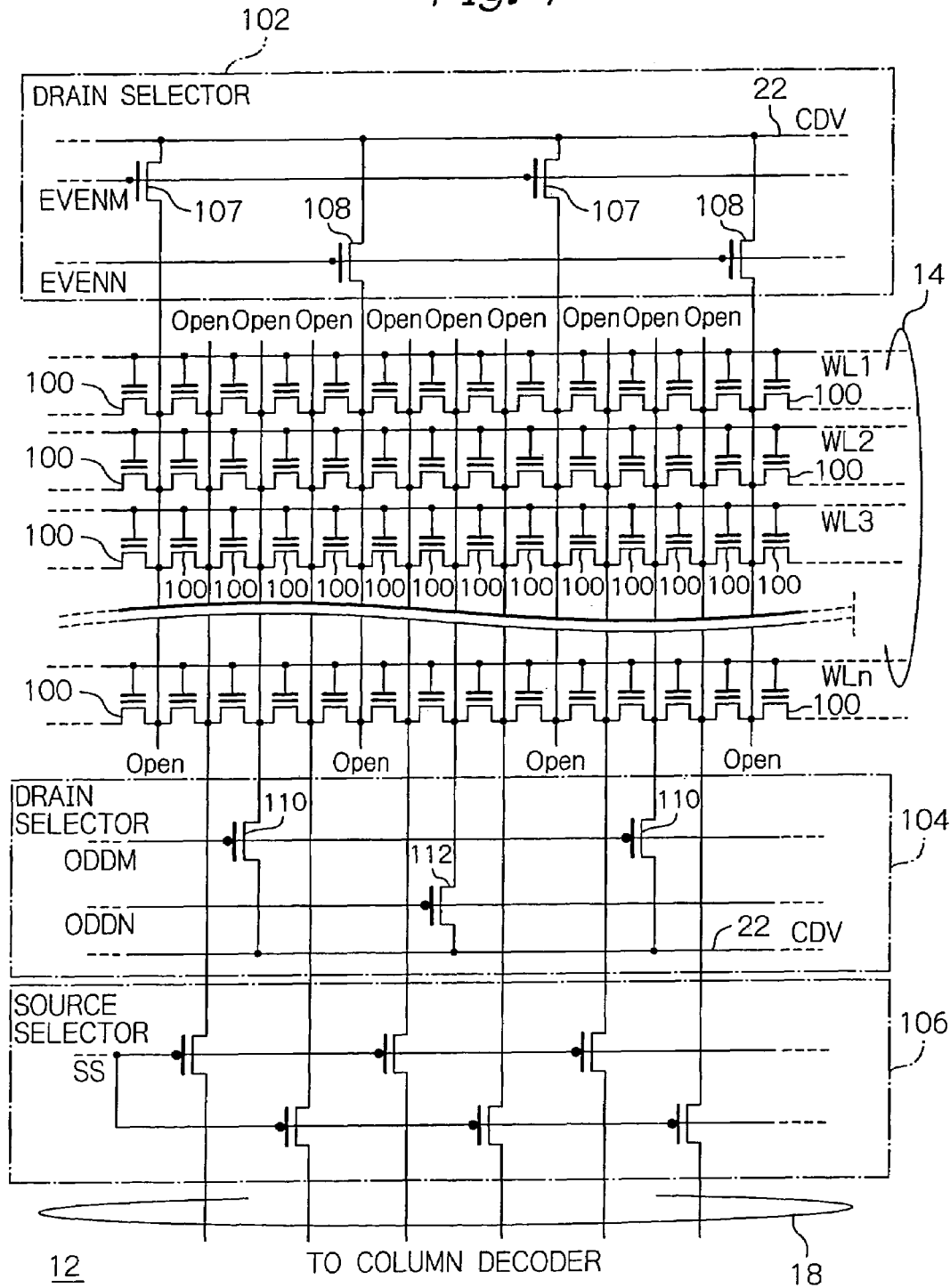
FIG. 1 illustrates an example of the constitution of a memory cell array circuit.

FIG. 1 shows an example of the constitution of the memory cell array circuit 12 of the instant embodiment. In the memory cell array circuit 12, the gate electrodes of the memory cells 100 are connected to the corresponding plural word lines (WL1 to WLn) 14. Each of the memory cells 100 has its drain electrode connected to either of drain selectors 102 and 104, which are adapted for selecting an even-numbered (EVEN) drain and an odd-numbered (ODD) drain, respectively. Each memory cell 100 has its source electrode connected to a source selector 106 by a bit line 18.

The drain selector 102 is adapted for selecting one of two drain electrodes, responsive to signals EVENM and EVENN, generated by the row decoder 16, FIG. 2, while the drain selector 104 is adapted for selecting one of two drain electrodes, responsive to signals ODDM and ODDN, generated by the row decoder 16. The drain selectors 102 and 104 operate for applying the cell drain voltage (CDV), supplied from the CDV generator 24, FIG. 2, to the selected drain electrode.

The one drain selector 102 includes a plural number of transistors 107 for selecting the drain electrode of every eighth memory cell 100 in response to the signal EVEVM and a plural number of transistors 108 for selecting the drain electrode of every eighth memory cell 100 in response to the signal EVENN. The transistors 107 and 108 are arranged with a spacing of four memory cells from one another and connected in this state to the memory cells 100. The other drain selector 104 includes a plural number of transistors 110 for selecting the drain electrode of every eighth memory cell 100 in response to the signal ODDM and a plural number of transistors 112 for selecting the drain electrode of every eighth memory cell 100 in response to the signal ODDN. The transistors 110 and 112 are arranged with a spacing of four memory cells from one another and connected in this state to the memory cells 100. In addition, the transistors 110 and 112 are arranged with an offset of two memory cells with respect to the transistors of the drain selector 102 connected to the memory cells 100.

More specifically, in the present embodiment, a four-drain route selection system is used in which the drain selectors 102 and 104, each having two selection routes, are used in selecting the drain electrodes. By this configuration, the writing for the memory cells 100 is effectuated at a rate of eight per one of the memory cells.

The drain selectors 102 and 104 apply the voltage CDV to one of the four bit lines to select one of the drain electrodes.

The non-selected drain electrodes are open. For example, if the signal EVENM or EVENN is selected, the voltage CDV is applied to one of the drain electrodes connected to the drain selector 102, while the drain electrodes connected to the drain selector 104 are open. On the other hand, the source electrode of a memory cell 100, as selected by the source selector 106, is connected via the bit line to the column decoder 20. Hence, the source electrodes, connected to other than the bit line selected by the column decoder 20, are open.

Figure 3:
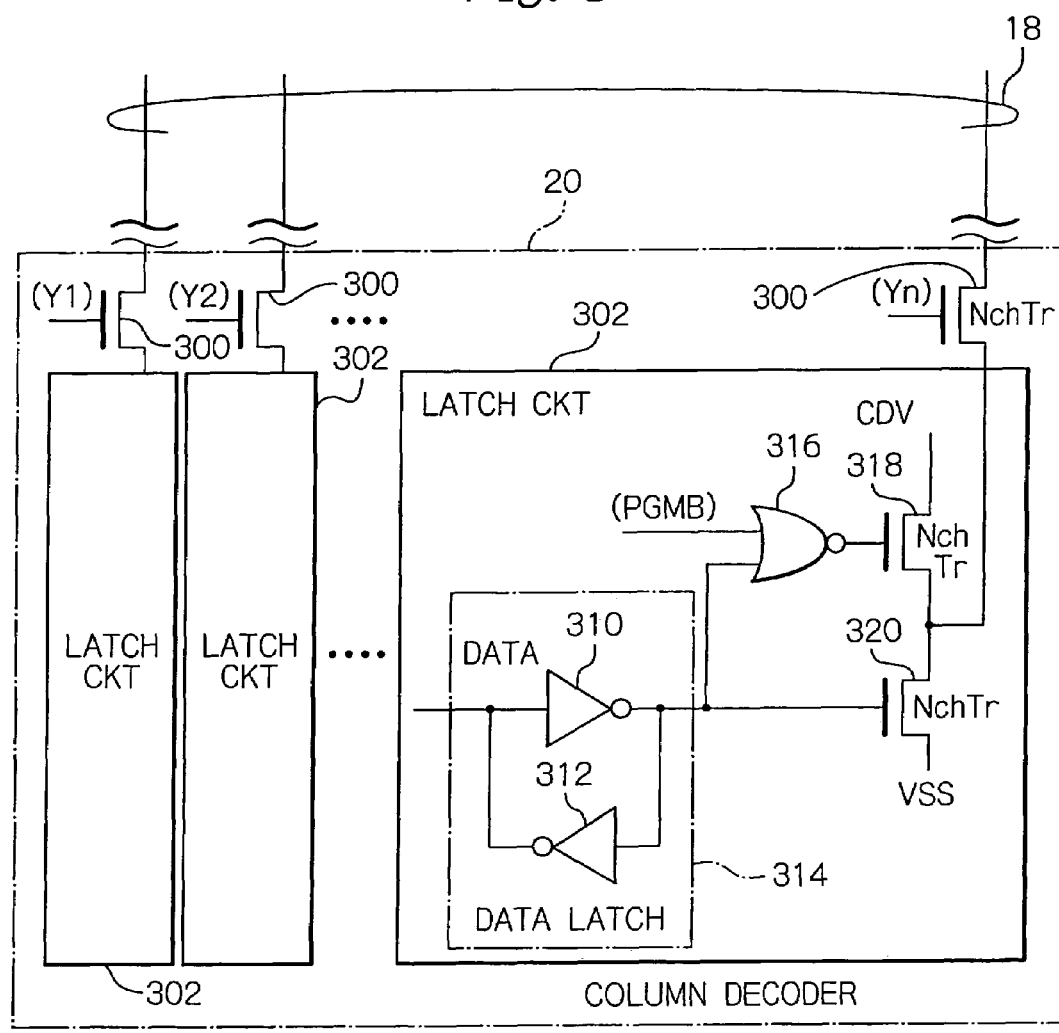
FIG. 3 is a schematic circuit diagram showing an example of the constitution of a column decoder included in the illustrative embodiment shown in FIG. 2.

Referring to FIG. 3, the column decoder 20 includes a plural number of N-channel MOS (Metal-Oxide Semiconductor) transistors 300, each connected to the bit line 18, and a plural number of latch circuits 302, associated with the respective N-channel transistors 300 and hence with the respective bit lines 18. The N-channel transistors 300 are responsive to column signals Y1 to Yn, entered to the gate electrodes, to select the bit lines 18.

Each of the latch circuits 302 includes a data latch 314, a NOR gate 316 and two N-channel transistors 318 and 320. The latch 314 serves as latching input data DATA by two inverter devices 310 and 312. The NOR gate 316 is connected to an output of the data latch 314 and takes NOR of the output of the data latch and a signal PGMB taking charge of write control. The N-channel transistors 318 and 320 are connected in series between the voltages CDV and VSS. The latch circuit 302 is a temporary storage circuit for supplying data held by the data latch 314 via the N-channel transistor 300 to the bit line 18 when the signal PGMB has been received. The NOR gate 316 is connected to the gate electrode of the transistor 318 and an output of the data latch 314 is connected to the gate electrode of the transistor 320. A junction point of the N-channel transistors 318 and 320 is connected to the bit line 18 via the N-channel transistor 300.

Figure 4:
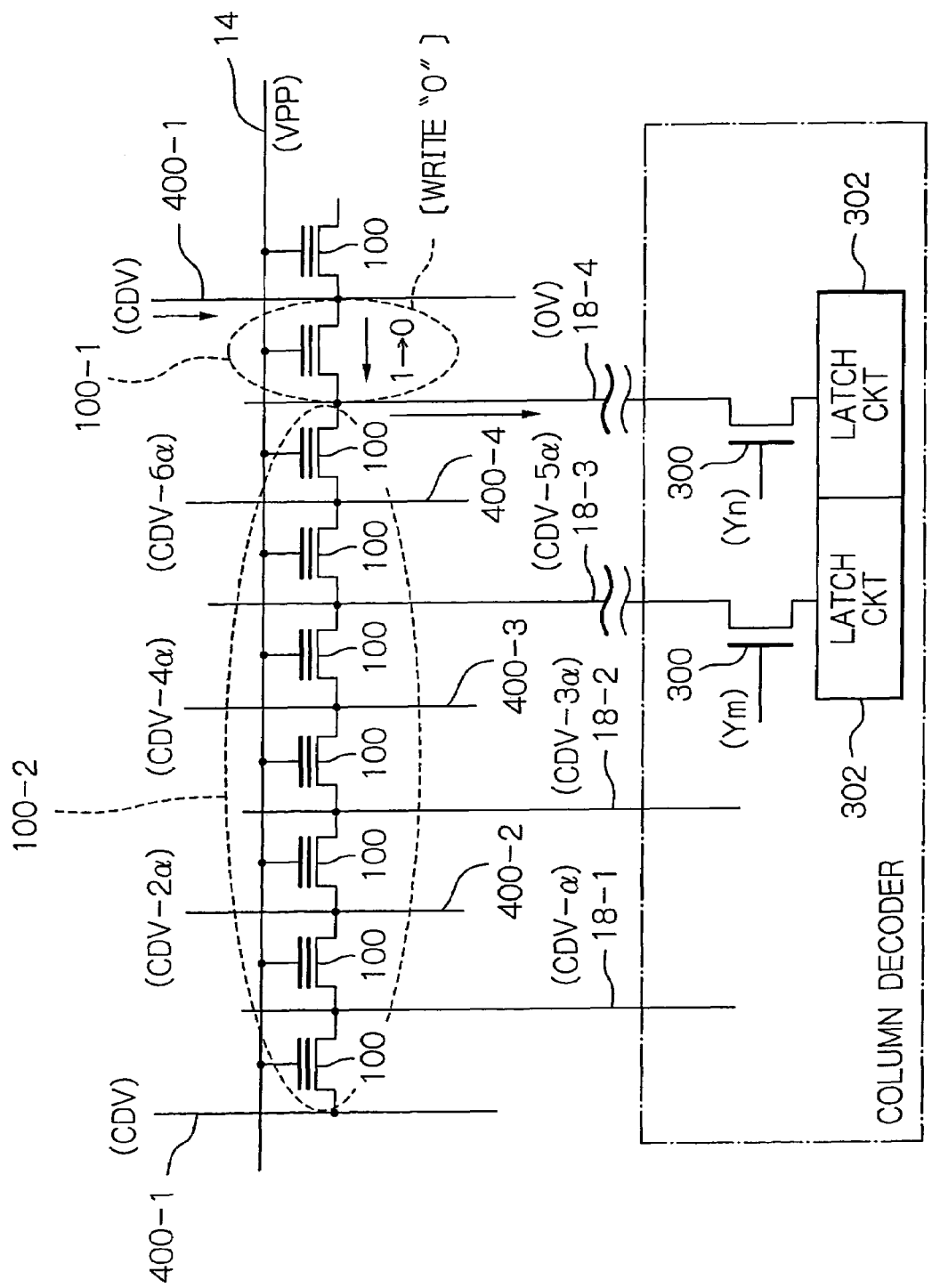
FIG. 4 is a schematic circuit diagram illustrating the state of writing in a memory cell included in the illustrative embodiment.
Figure 5:
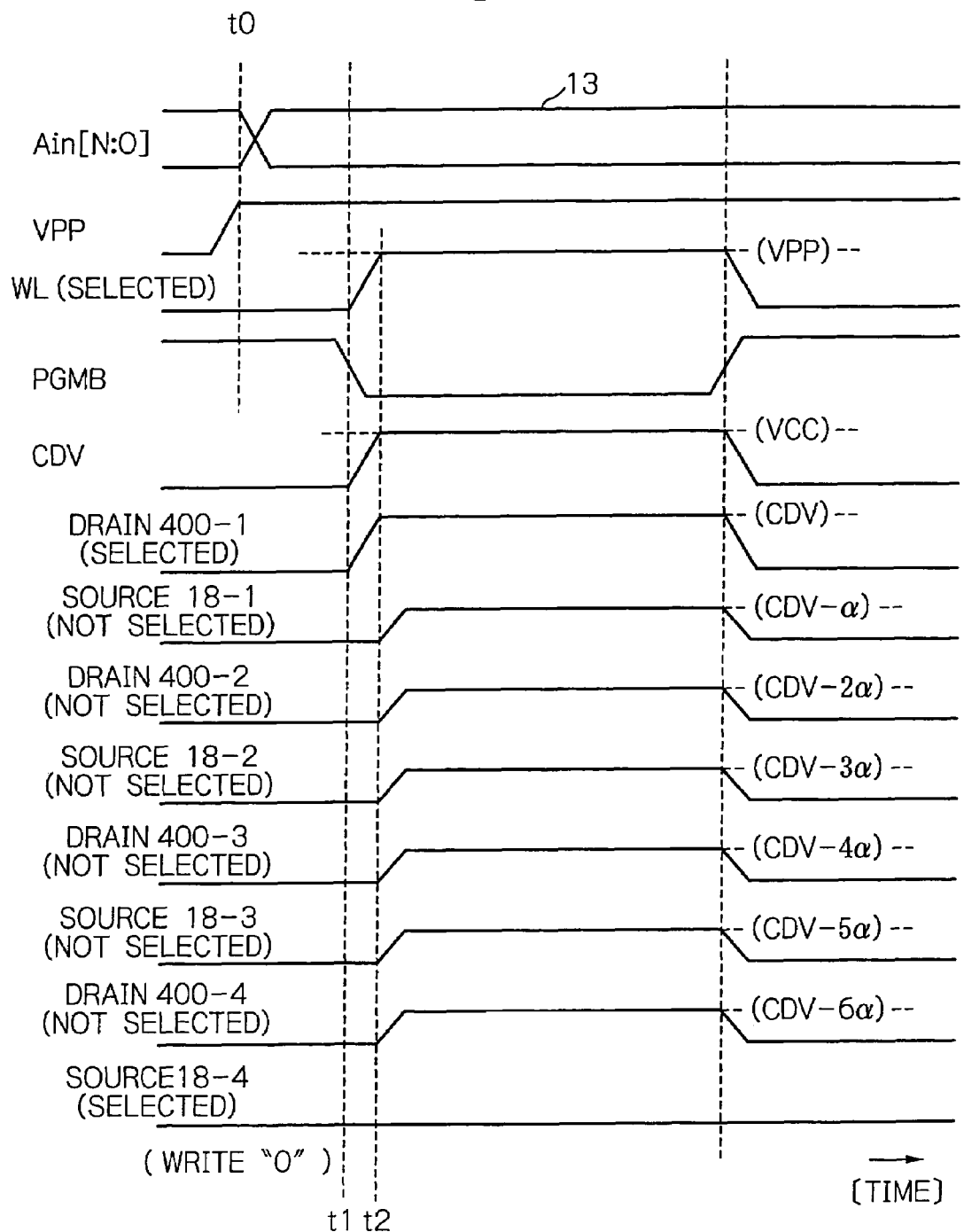
FIGS. 5 and 6 are timing charts useful for understanding the write operation of the illustrative embodiment.

In the above configuration, the operation of the non-volatile memory 10 will now be described with reference to FIGS. 4 and 5. When data "0" is to be written in the memory cell 100-1, as a target for writing, the voltage VPP is applied to the gate electrode 14 at time t0. The voltage CDV is applied to the drain electrodes 400 as selected by the drain selectors 102 and 104 at a rate of one to four drain electrodes as from time t1 until time t2. The voltage VPP is applied to the selected word line WL. The voltage from the latch circuit 302, connected to the bit line, as selected by the column decoder 20, is applied to a source electrode 18-4. This voltage is 0 volt [V]. A large quantity of the current then flows through the memory cell as a target for writing so that electrical charges are injected into the floating gate electrode of the memory cell. Thus, the threshold voltage Vt is increased from the blank state "1" to execute the writing of the data "0".

In writing data "1", the same voltages as those mentioned above are applied to the gate and drain electrodes of the memory cell 100 which has been selected for writing. To the source electrode of the memory cell 100, selected for writing, the voltage CDV from the latch circuit 302 is applied, so that a voltage equal to (CDV−Vt) is applied to the source electrode of the memory cell 100 selected for writing. At this time, the potential difference between the drain and source electrodes is of the order of the threshold voltage Vt, so that the current scarcely flows and hence no electrical charges are injected.

The result is that noting is written and the value of "1" is maintained.

The non-selected drain electrodes 400-2 to 400-4 and the non-selected source electrodes 18-1 to 18-3 are in the open state thereof. Thus, the voltages obtained on voltage division from the voltage CDV applied to the selected drain electrode 400-1, that is, the voltages equal to (CDV−Nα), are applied to the respective drain and source electrodes. Specifically, the voltages CDV−α, CDV−2α, CDV−3α, CDV−4α, CDV−5α, CDV−6α and CDV−7α are applied to the drain and source electrodes of the respective memory cells 100 of the memory cells 100-2, as shown. The value a stands for the voltage applied to each memory cell as a result of the voltage division. In short, only the source drain voltage as low as approximately 0.6 to 0.7 V is generated in the memory cells 100 of the non-selected memory cell 100-2 neighboring to the selected memory cell 100-1. Consequently, there is no fear of the current flowing through the memory cells other than the selected memory cell, thus preventing erroneous writing.

Thus, with the system in which the drain selectors are directed to the four-drain selection route configuration and in which one of four drain electrodes is selected to apply the voltage CDV to this selected drain electrode, it is possible to reduce the potential difference caused between the drain and source electrodes of the non-selected memory cell to prevent erroneous writing in the non-selected memory cells.

An alternative embodiment of the non-volatile memory according to the present invention will now be described. Since the capacitance of selected one of the bit lines of the illustrative embodiment shown in FIGS. 1 to 5 becomes doubled, there is caused a delay in the bit line charging time.

Figure 6:
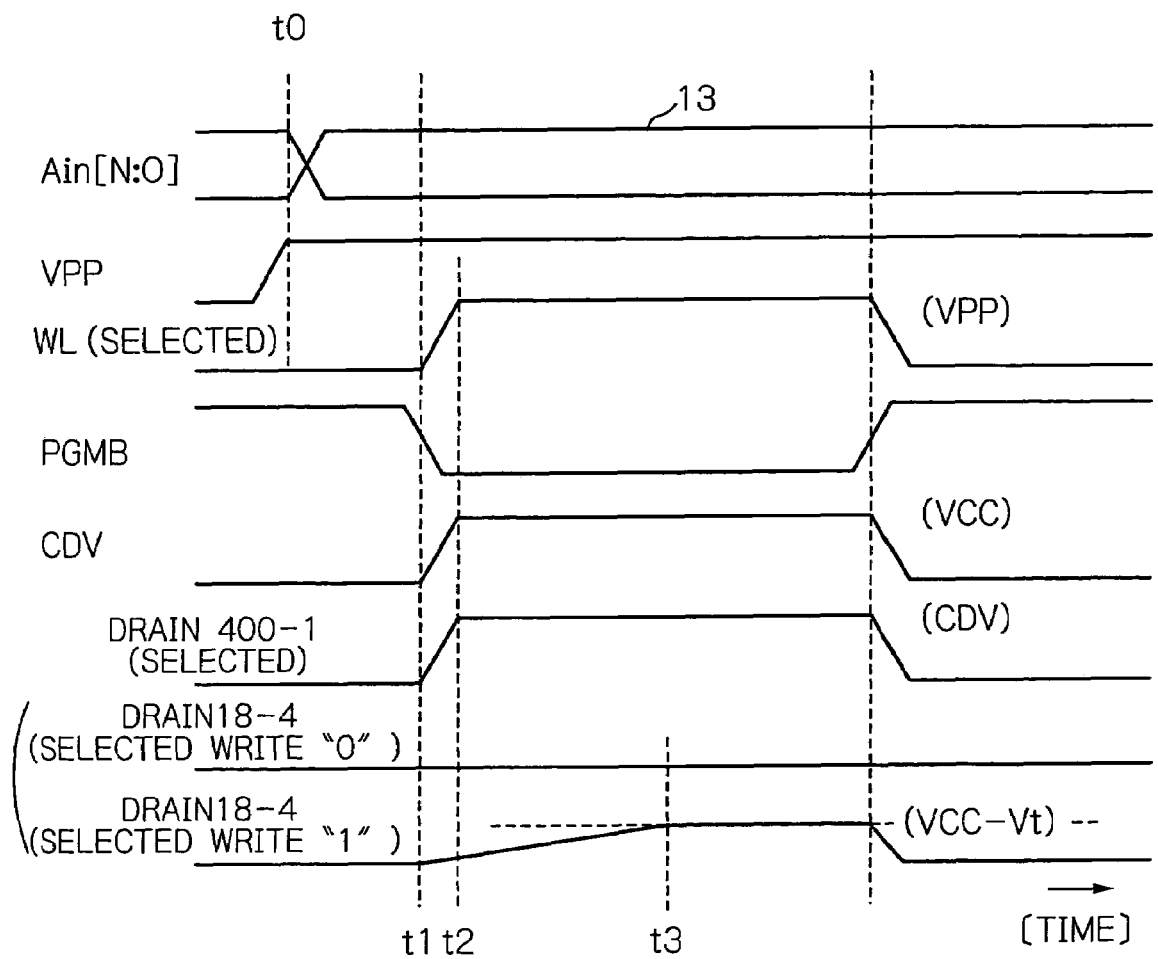

Specifically, as shown in FIG. 6, there is caused a delay from time t1 until time t3 during which the bit line selected is charged to a potential equal to (VCC−Vt), at the time of writing data "1". Since the state which is the same as that during writing data "0" then prevails until the bit line is charged to the potential equal to (VCC−Vt), the current continues to flow through the selected memory cell 100-1, so that there is fear of erroneous writing.

Figure 7:
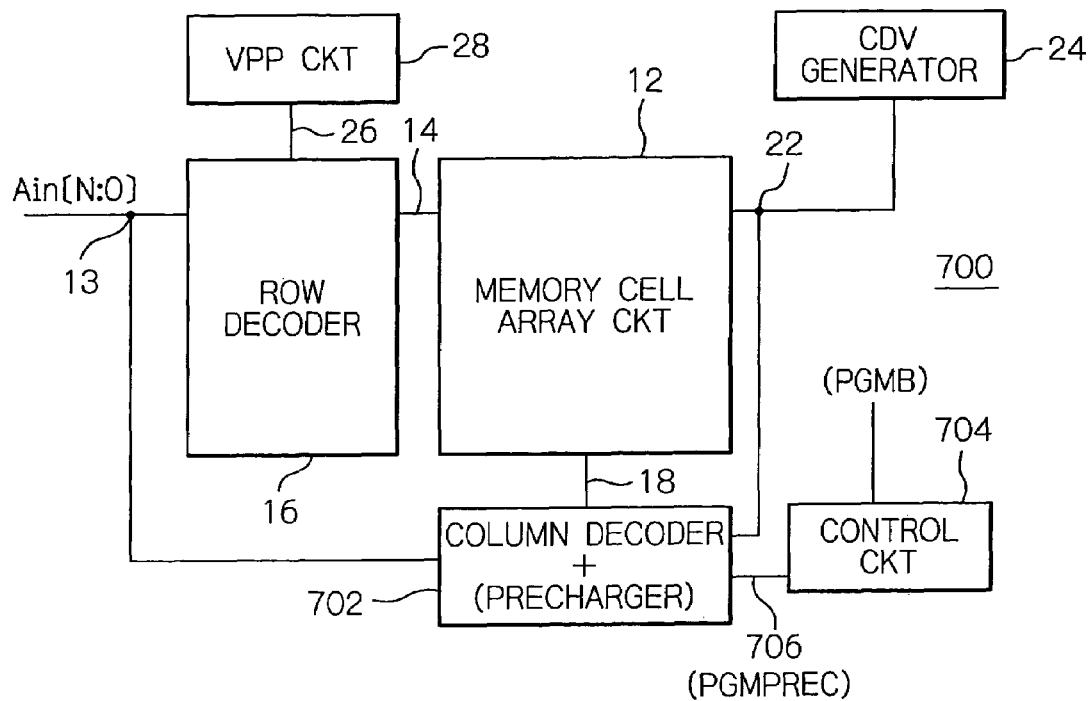
FIG. 7 is a schematic block diagram showing an alternative embodiment of a non-volatile memory according to the present invention.

A non-volatile memory 700 of the present alternative embodiment is shown in FIG. 7. As seen from the figure, the non-volatile memory includes a column decoder 702 corresponding to the column decoder 20 in the non-volatile memory 10 shown in FIG. 2, plus a precharger, while also including a control circuit 704. Except those features, the present alternative embodiment may be the same in configuration as the non-volatile memory 10 of the previous embodiment shown in FIG. 2 and hence the repetitive description thereon will be dispensed with.

The control circuit 704 is adapted to receive the signal PGMB, to be produced at the time of writing, and output a signal PGMPREC to the column decoder 702. The column decoder 702 has the function to be responsive to the signal PGMPREC transmitted from the control circuit 704 to precharge a bit line to a voltage equal to (VCC−Vt).

Figure 8:
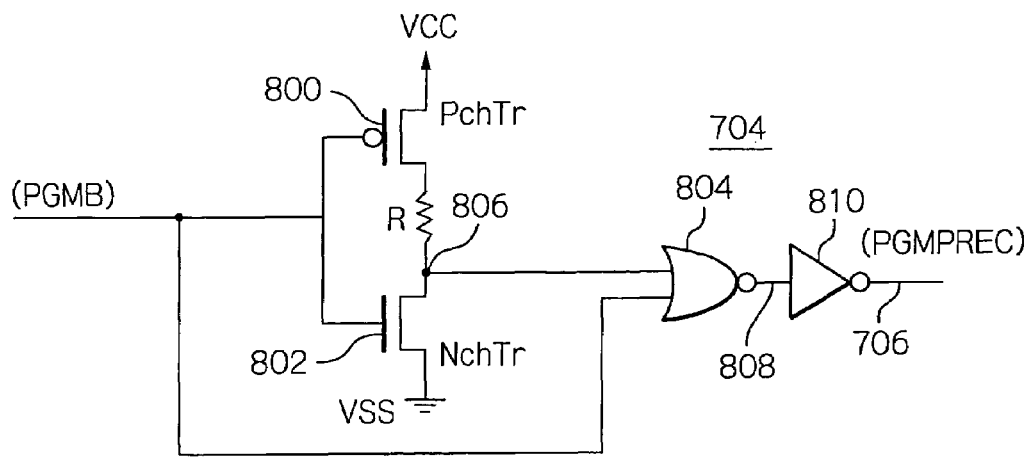
FIG. 8 is a schematic circuit diagram showing an example of the constitution of a control circuit included in the alternative embodiment.

Referring more specifically to FIG. 8, the control circuit 704 includes a P-channel transistor (PchTr) 800, connected to a voltage VCC, and an N-channel transistor 802, connected to a voltage VSS. The P-channel transistor 800 and the N-channel transistor 802 are connected in series with each other via a resistor R. The signal PGMB is transmitted to the gate electrodes of the P-channel and N-channel transistors 800 and 802. Those transistors have the gate electrodes thereof connected to one input of a NOR gate 804, which has its other input connected to the node or junction 806 of the resistor R and the N-channel transistor 802. The NOR gate 804 has its output 808 connected to an inverter 810, which has its output constituting the output of the control circuit 704.

Figure 9:
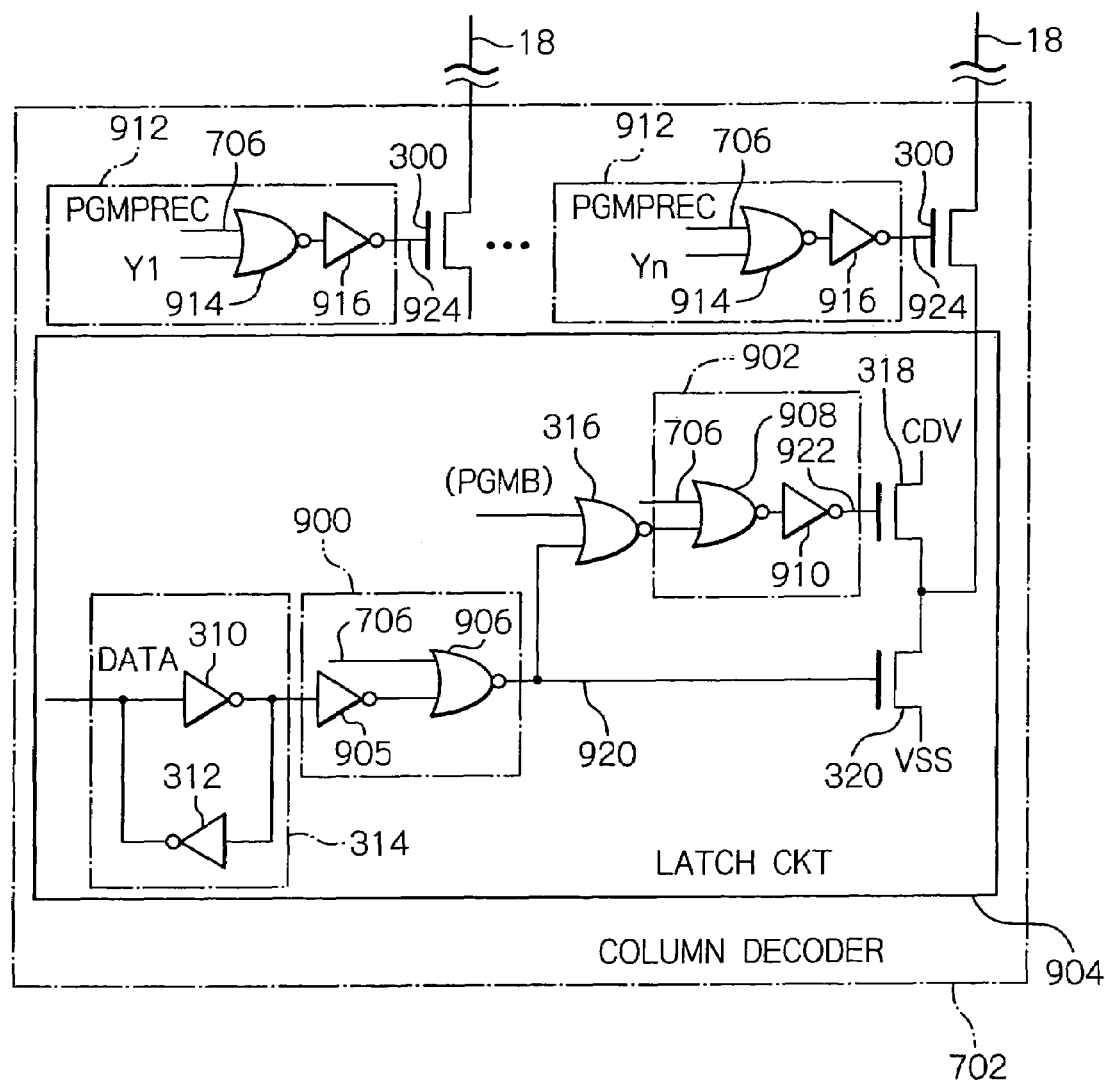
FIG. 9 is a schematic circuit diagram showing an example of the constitution of a column decoder included in the alternative embodiment.

Well referring to FIG. 9, the column decoder 702 includes a latch circuit 904 which corresponds to the latch circuit 302 shown in FIG. 3 with two prechargers 900 and 902 additionally incorporated. As shown, the one precharger 900 includes an inverter 905, connected to an output of the data latch 314, and a NOR gate 906 connected for taking NOR of an output of the inverter 905 and an output signal PGMPREC 706 of the control circuit 704. In the descriptive portion of the application, signals are also designated with reference numerals of connections on which they are conveyed. The NOR gate 906 has its output 920 forming an output of the precharger 900 and coupled to the NOR gate 316 and to the transistor 318. The other precharger 902 includes an NOR gate 908 for taking NOR of an output signal of the NOR gate 316 and the signal PGMPREC 706 and an inverter 910 for inverting an output of the NOR gate 908. The inverter 910 has its output 922 constituting an output of the precharger 902.

The column decoder 702 has prechargers 912 connected to the gate electrode 924 of the respective N-channel transistors 300. Each precharger 912 includes a NOR gate 914 for taking NOR of the signal PGMPREC 706 and column signals Y1 to Yn, and an inverter 916 adapted for inverting the output of the NOR gate 914. The inverter 916 has its output constituting an output 924 of the precharger 912.

In the above-described constitution, when the signal PGMPREC is produced, a bit line selected is precharged via the N-channel transistor 318 to a voltage equal to (VCC−Vt). All of the bit lines may also be selected, when the signal PGMPREC is generated, so that all bit lines will be precharged by the precharger 912.

Figure 10:
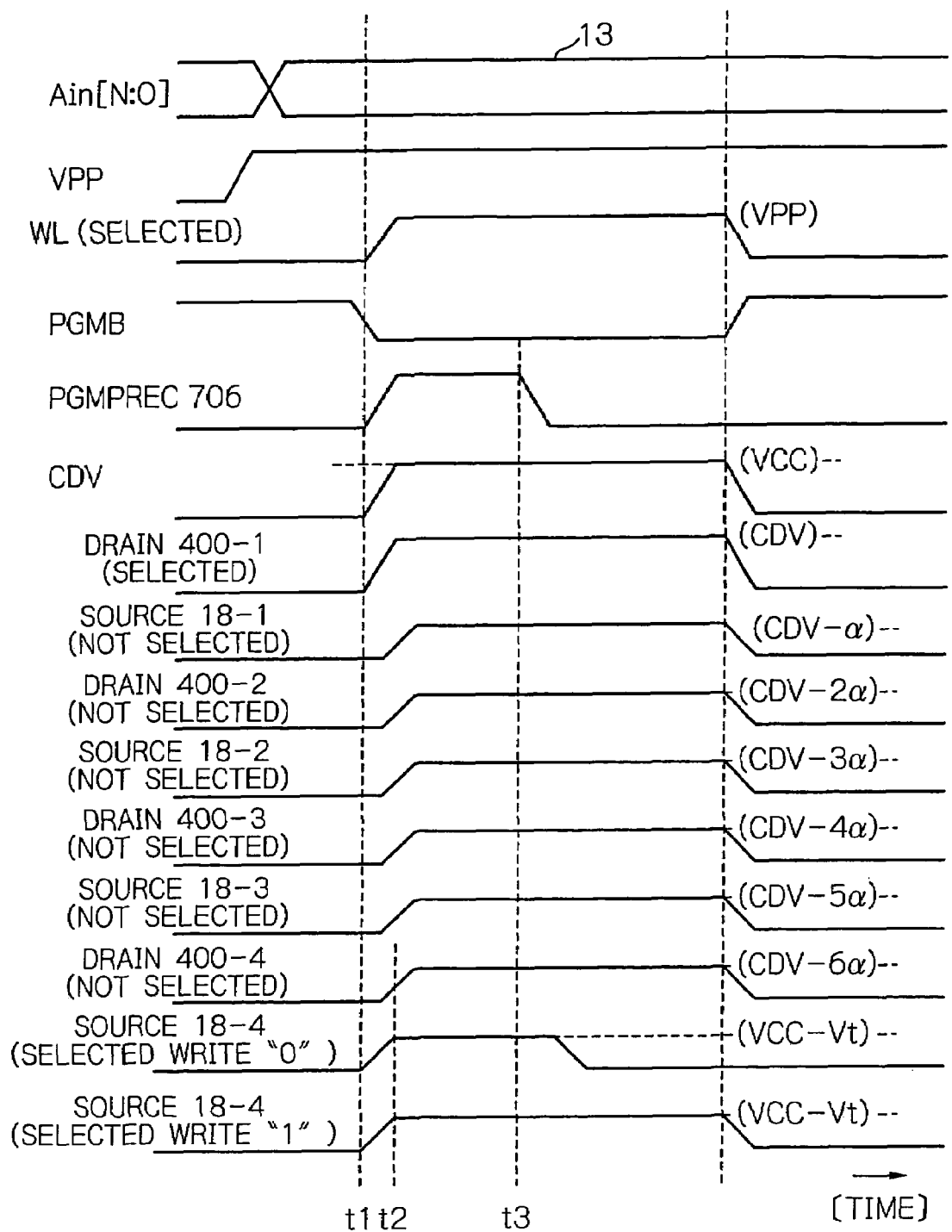
FIG. 10 is a timing chart useful for understanding the write operation of the alternative embodiment.

In the above-described constitution, the operation of the non-volatile memory 700 of the instant alternative embodiment will now be described with reference to FIG. 10. When the signal PGMB is provided, at time t1, during writing in a memory cell, the control circuit 704 generates a signal PGMPREC 706 in the form of pulse sufficient to precharge a bit line to a voltage equal to (VCC−Vt). The pulse width or duration, from time t1 to t3, of the signal PGMPREC 706 is controlled by the resistor R.

When the signal PGMPREC 706 is generated, all of the bit lines are selected. At the same time, the signal PGMPREC 706 is entered to the latch circuit 904, so that all of the bit lines are precharged to the voltage equal to (VCC−Vt) through the transistor 318. Consequently, the bit line, selected at the time of writing the data "1", is at the voltage equal to (VCC−Vt) at time t2 beforehand and hence the bit line selected has been charged to the voltage equal to (VCC−Vt) without causing the delay. On the other hand, for writing the data "0", the bit line is quickly set to the voltage 0 volt [V], whereby the current flows through the memory cell selected, so that the data "0" is written quickly.

Thus, in the present alternative embodiment, the precharger 912 for selecting all of the bit lines, responsive to the signal PGMPREC, is provided in the column decoder 702, and the prechargers 900 and 902 for driving the transistor 318, supplied with the voltage CDV, are provided within the latch circuit 904, all of the bit lines can be precharged to the voltage equal to (VCC-Vt) at the time of the writing. Moreover, when writing "1" in the selected memory cell, there is no fear of a low voltage being applied to the source electrode of the memory cell 100. Hence, there is generated scarcely any potential difference between the drain and source electrodes. Thus, the current flowing in the memory cell 100 may be suppressed to prevent the occurrence of erroneous writing.

Figure 11:
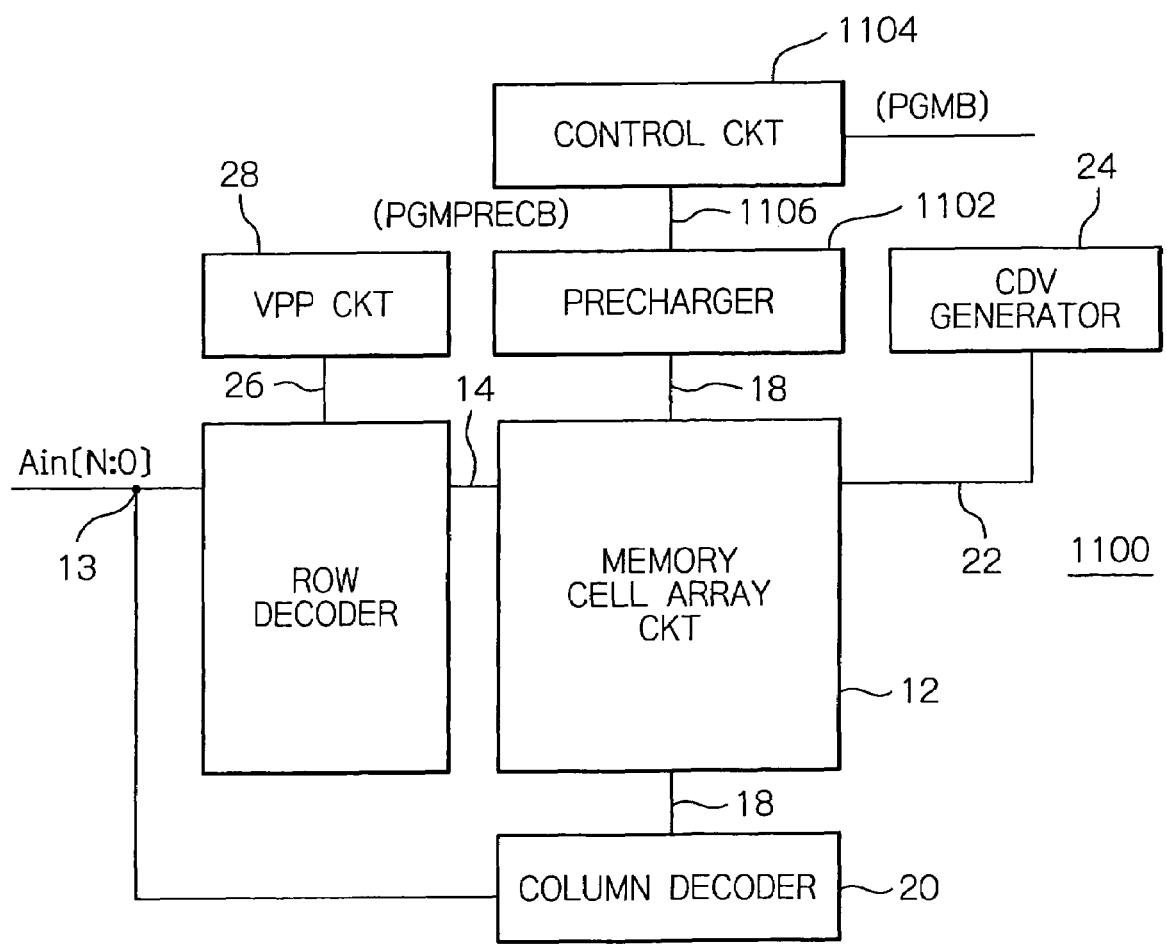
FIG. 11 is a schematic block diagram showing another alternative embodiment of a non-volatile memory according to the present invention.

Referring to FIG. 11, another alternative embodiment of the non-volatile memory 10 will now be described according to the present invention. The instant alternative embodiment includes a non-volatile memory 1100, which has a precharger 1102 corresponding to the latch circuit 904 which would be excluded from the column decoder 702 of the previous alternative embodiment shown in and described with reference to FIG. 9. In the instant alternative embodiment, the precharger 1102, thus separated, is connected to the bit lines 18, and adapted to receive a signal PGMPREC, output from a control circuit 1104, on its input port 1106.

In the previously described alternative embodiment, the bit line 18 is precharged by the transistor 300. Hence, there may be caused slight delay in the charging time. Moreover, since the circuit for selecting all bit lines 18 upon receipt of the signal PGMPREC is added to the column decoder 702, there is fear that the circuit may be increased in size.

Thus, in the present alternative embodiment, the precharger 1102 is configured for connecting each bit line 18 through a P-channel transistor 1200 to the voltage VCC. A signal PGMPREC 1106 from the control circuit 1104 is input to the gate electrode of the P-channel transistor 1200.

Figure 12:
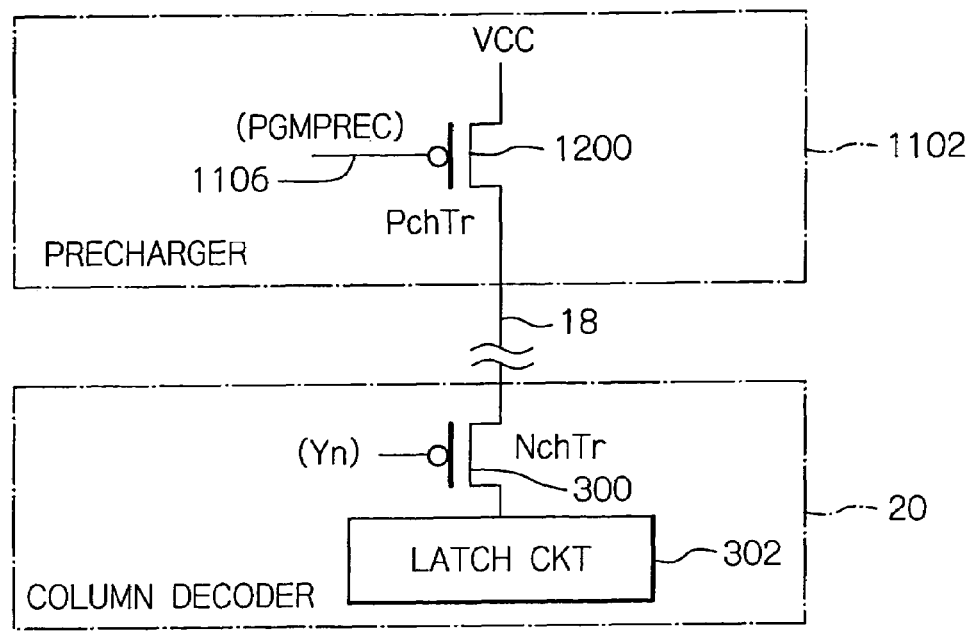
FIG. 12 is a schematic circuit diagram showing an example of the constitution of a precharger included in the alternative embodiment shown in FIG. 11.
Figure 13:
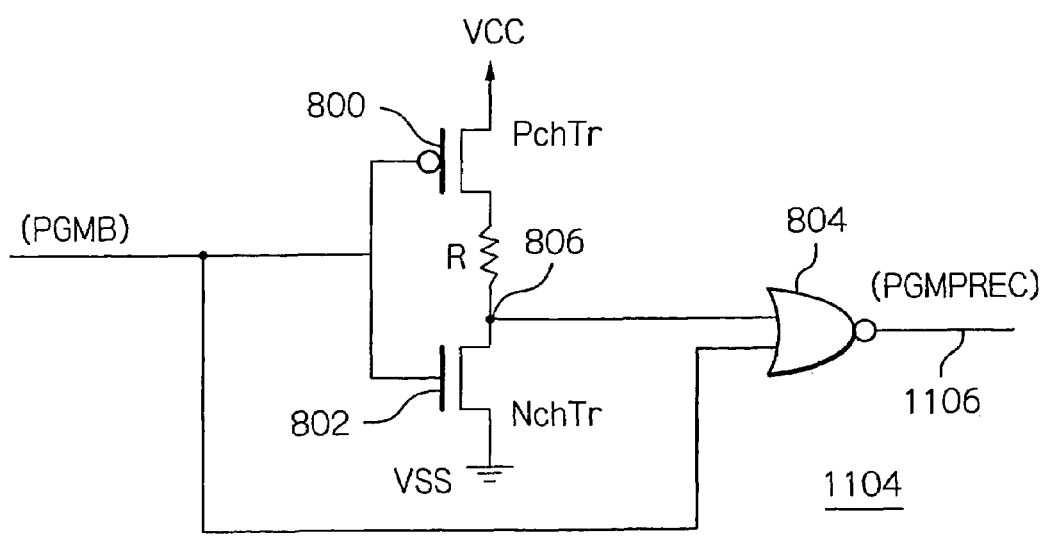
FIG. 13 is a schematic circuit diagram showing an example of the constitution of a control circuit included in the alternative embodiment shown in FIG. 11.

The control circuit 1104 in the present alternative embodiment may be equivalent to the control circuit 704 of the embodiment shown in FIG. 8 less the inverter 806. The NOR gate 804 has its output 1106 forming the output of the control circuit 1104. The output 1106 of the control circuit is connected to the precharger 1102, FIGS. 12 and 13.

Figure 14:
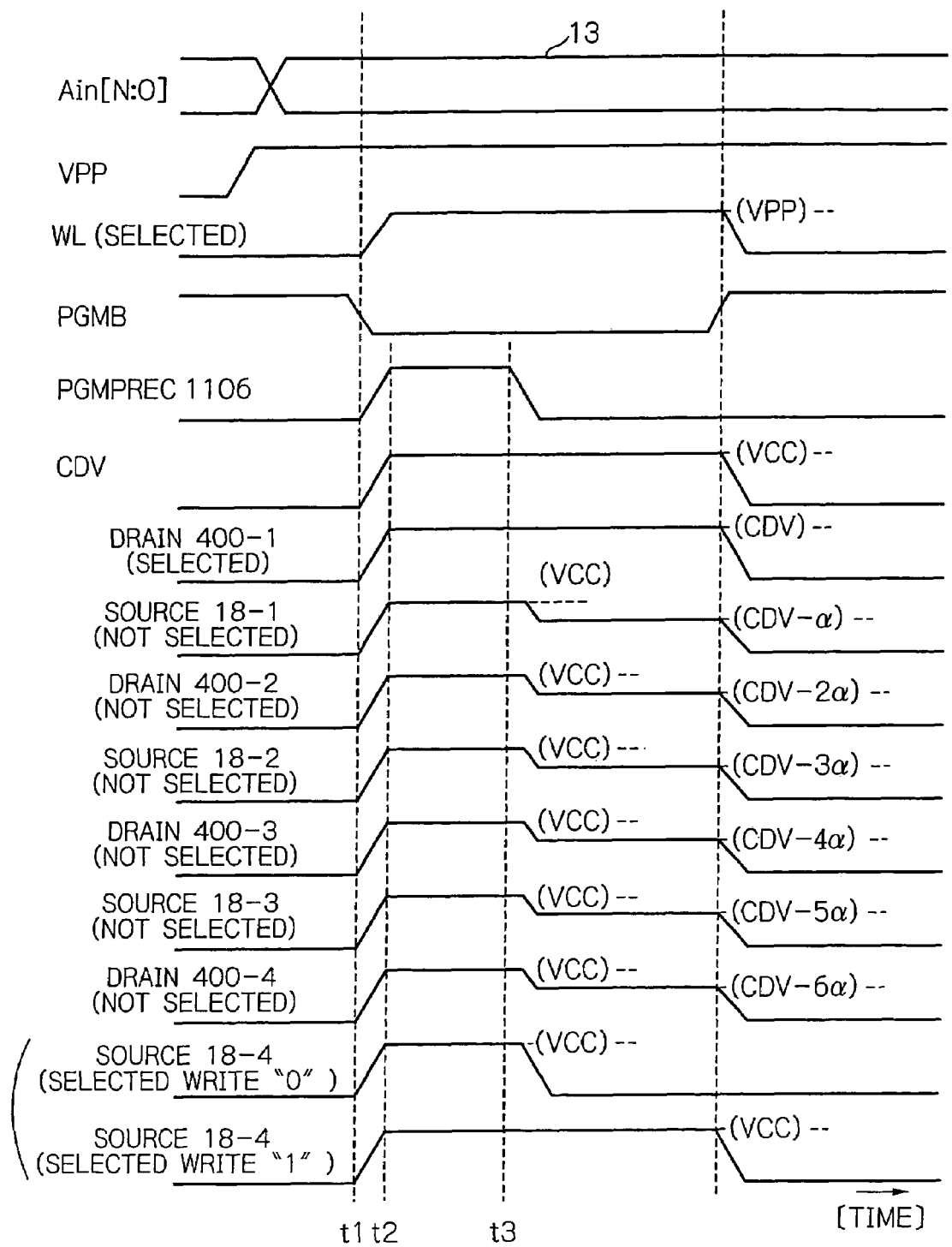
FIG. 14 is a timing chart useful for understanding the write operation of the alternative embodiment shown in FIG. 11.

In the above constitution, the operation of the non-volatile memory 1100 of the present alternative embodiment will be described with reference to FIG. 14. When the signal PGMB is generated at time t1 during writing in the memory cell, the control circuit 1104 generates the signal PGMPREC 1106, in the form of pulse sufficient to precharge a bit line to a voltage equal to (VCC-Vt). The pulse width, time t1 to t3, of the signal PGMPREC is controlled by the resistor R.

When the signal PGMPREC 1106 is generated, all of the bit lines 18 are selected by the P-channel transistor 1200 in the precharger 1102, at the same time as all of the bit lines 18 are promptly precharged to the voltage VCC without any variations. In this manner, the bit lines selected at the time of writing are at the voltage VCC at time t2 beforehand, and hence the bit lines are charged to the voltage VCC without delay. On the other hand, in writing the data "0", the bit line is quickly set to the voltage "0" to cause the current to flow through the selected memory cell to write the data "0" promptly.

According to the present alternative embodiment, the prechargers for coupling to the voltage VCC through the P-channel transistors 1104 are provided for the totality of the bit lines 18, and therefore the bit lines 18, selected for writing, may be precharged quickly to the voltage VCC without any variations. On the other hand, since no low voltage is applied to the source electrodes of the memory cells 100, at the time of writing "1" in the selected memory cell, there is produced scarcely any potential difference between the drain and source electrodes, thereby suppressing the current flowing through the memory cells 100. This, in turn, prevents the erroneous writing from occurrence.

The above-described embodiments are applied to the four-drain selection route system. This is not to be restrictive since the drain electrodes may be selected in three or six separate selection routes, for example. In these cases, erroneous writing may be prohibited as in the above-described embodiments. Also, in the embodiments described with reference to FIGS. 7 and 11, the precharge voltage is equal to the voltage VCC. This is also not restrictive but a circuit or circuits for generating other specified voltage or voltages may be added in order to provide for variations in the precharge voltages.

The present invention also provides a method for writing in a non-volatile memory for storing data electrically writably, in which the memory includes a memory cell array. The memory cell array forms a plurality of memory cell rows, each of the memory cell rows being formed by a plurality of memory cells. Each of the memory cells includes a plurality of memory cell transistors, which have the source and drain electrodes connected in series to constitute a memory row. The memory cell array also includes a plurality of word lines, each interconnecting the gate electrodes of the memory cell transistors of the memory cell rows, and a plurality of bit lines interconnecting connecting points or nodes of the memory cell transistors of the memory cell rows in a direction substantially perpendicular to the memory rows. The memory cell array also includes a first drain selector connected to ones of the bit lines at a first interval for selecting the drain electrodes of the memory cell transistors. The first interval corresponds to a predetermined number of the memory cell transistors. The memory cell array also includes a second drain selector for selecting the drain electrodes of the memory cell transistors. The second drain selector is connected to other ones of the bit lines at an interval equal to the first interval, which are shifted in position from the first interval by a value equal to one-half of the predetermined number of the memory cell transistors. The memory cell array further includes a source selector connected to bit lines lying intermediate between the bit lines to which the first and second drain selectors are connected. The first and second drain selectors select the drain electrodes in a plural number of different selection routes to write data in the so selected memory cell transistors.

In the method for writing in a non-volatile memory, the first drain selector selects the drain electrodes in two selection routes.

In the method for writing in a non-volatile memory, the second drain selector selects the drain electrodes in two selection routes.

In the method for writing in a non-volatile memory, the memory further includes a column decoder for selecting the memory cell transistors and for supplying the selected memory cell transistors with a first voltage for writing the data.

The column decoder selects all of the bit lines and precharges the bit lines with an N-channel transistor.

In the method for writing in a non-volatile memory, the memory includes a column decoder for selecting the memory cell transistors and for supplying the selected memory cell transistors with a first voltage for writing the data, and the bit lines are precharged by supplying the second voltage to all of the bit lines from plural P-channel transistors.

The entire disclosure of Japanese patent application No. 2005-347676 filed on Dec. 1, 2005, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A non-volatile memory having a memory cell array for storing data electrically, comprising:
   a plurality of rows of memory cells, each of said rows of memory cells including a plurality of memory cell transistors having source and drain electrodes serially interconnected between neighboring ones of the memory cell transistors;
   a plurality of word lines each interconnecting gate electrodes of said memory cell transistors of said rows of memory cells;
   a plurality of bit lines interconnecting connecting points of said memory cell transistors of said rows of memory cells in a direction substantially perpendicular to said memory rows;
   a first drain selector connected to ones of said bit lines at a first interval for selecting the drain electrodes of said memory cell transistors on the one bit lines, the first interval corresponding to a predetermined number of said memory cell transistors;
   a second drain selector connected to other ones of said bit lines at a second interval for selecting the drain electrodes of said memory cell transistors on the other bit lines, the first interval being equal to a multiple of the second intervals, said other bit lines being shifted in position from the first interval by a value equal to one-half of the predetermined number of said memory cell transistors; and
   a source selector for selecting the source electrodes of said memory cell transistors, said source selector being connected to said bit lines lying intermediate between the bit lines to which said first and second drain selectors are connected;
   said first drain selector including a first plurality of transistors having a control electrode interconnected in common to respective one of a first corresponding plurality of signal lines any one of which is selectively activated by a row decoder,
   said second drain selector including a second plurality of transistors having a control electrode interconnected in common to a second signal line activatable by said row decoder.

2. The non-volatile memory in accordance with claim 1, wherein said first drain selector selects the drain electrodes in two selection routes, said first plurality of transistors includes two transistors.

3. The non-volatile memory in accordance with claim 1, further comprising a column decoder for selecting said memory cell transistors and for supplying the selected memory cell transistors with a voltage for writing the data;
   said column decoder including:
   a selector for selecting all of said bit lines;
   a precharger having an N-channel transistor for precharging said bit lines; and
   a control circuit for controlling said first precharger.

4. The non-volatile memory in accordance with claim 1, further comprising:
   a column decoder for selecting said memory cell transistors and for supplying said selected memory cell transistors with a first voltage for writing the data; and
   a precharger including a plurality of P-channel transistors for supplying a second voltage precharging all of said bit lines.

5. The non-volatile memory in accordance with claim 1, wherein the second signal line is provided correspondingly in plurality so that said second plurality of transistors have the control electrode interconnected in common to respective one of the plurality of second signal lines, any one of the second signal lines being selectively activated by said row decoder.

6. A non-volatile memory having a memory cell array for storing data electrically, comprising:
   a plurality of rows of memory cells, each of said rows of memory cells including a plurality of memory cell transistors having source and drain electrodes serially interconnected between neighboring ones of the memory cell transistors;
   a plurality of word lines each interconnecting gate electrodes of said memory cell transistors of said rows of memory cells;
   a plurality of bit lines interconnecting connecting points of said memory cell transistors of said rows of memory cells in a direction substantially perpendicular to said memory rows;
   a first drain selector connected to ones of said bit lines at a first interval for selecting the drain electrodes of said memory cell transistors on the one bit lines, the first interval corresponding to a predetermined number of said memory cell transistors;
   a second drain selector connected to other ones of said bit lines at a second interval for selecting the drain electrodes of said memory cell transistors on the other bit lines, the first interval being equal to the second interval, said other bit lines being shifted in position from the first interval by a value equal to one-half of the predetermined number of said memory cell transistors;
   a source selector for selecting the source electrodes of said memory cell transistors, said source selector being connected to said bit lines lying intermediate between the bit lines to which said first and second drain selectors are connected; and
   a column decoder for selecting said memory cell transistors and for supplying said selected memory cell transistors with a first voltage for writing the data; and
   a precharger including a plurality of P-channel transistors for supplying a second voltage precharging all of said bit lines;
   said first drain selector including a first plurality of transistors having a control electrode interconnected in common to respective one of a first corresponding plurality of signal lines any one of which is selectively activated by a row decoder,
   said second drain selector including a second plurality of transistors having a control electrode interconnected in common to a second signal line activatable by said row decoder;
   wherein the second signal line is provided correspondingly in plurality so that said second plurality of transistors have the control electrode interconnected in common to respective one of the plurality of second signal lines, any one of the second signal lines being selectively activated by said row decoder; and
   wherein said second drain selector selects the drain electrodes in two selection routes, said second plurality of transistors includes two transistors.

7. The non-volatile memory in accordance with claim 6, wherein said first drain selector selects the drain electrodes in two selection routes, said first plurality of transistors includes two transistors.

8. The non-volatile memory in accordance with claim 6, wherein the second signal line is provided correspondingly in plurality so that said second plurality of transistors have the control electrode interconnected in common to respective one of the plurality of second signal lines, any one of the second signal lines being selectively activated by said row decoder.

* * * * *